US010297629B2

(12) United States Patent
Lenchenkov et al.

(10) Patent No.: US 10,297,629 B2
(45) Date of Patent: May 21, 2019

(54) IMAGE SENSORS WITH IN-PIXEL LENS ARRAYS

(71) Applicant: SEMICONDUCTOR COMPONENTS INDUSTRIES, LLC, Phoenix, AZ (US)

(72) Inventors: Victor Lenchenkov, Sunnyvale, CA (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/701,116

(22) Filed: Sep. 11, 2017

(65) Prior Publication Data

US 2019/0081098 A1    Mar. 14, 2019

(51) Int. Cl.
| | |
|---|---|
| *H01L 27/146* | (2006.01) |
| *H04N 9/07* | (2006.01) |
| *H04N 9/04* | (2006.01) |
| *H04N 5/353* | (2011.01) |
| *H04N 5/378* | (2011.01) |
| *G02B 13/00* | (2006.01) |
| *G02B 3/00* | (2006.01) |

(52) U.S. Cl.
CPC ...... *H01L 27/14627* (2013.01); *G02B 3/0056* (2013.01); *G02B 13/0085* (2013.01); *H01L 27/1462* (2013.01); *H01L 27/1464* (2013.01); *H01L 27/14621* (2013.01); *H01L 27/14636* (2013.01); *H01L 27/14645* (2013.01); *H04N 5/3535* (2013.01); *H04N 5/378* (2013.01); *H04N 9/045* (2013.01); *H04N 9/07* (2013.01); *H04N 2209/042* (2013.01)

(58) Field of Classification Search
CPC ......... H01L 27/14627; H01L 27/14636; H01L 27/1464; H01L 27/14621; H01L 27/1462; H01L 27/14645; H04N 9/07; H04N 9/045; H04N 5/3535; H04N 5/378; H04N 2209/042; G02B 13/0085; G02B 3/0056
USPC ....................................................... 348/340
See application file for complete search history.

(56) References Cited

U.S. PATENT DOCUMENTS

| | | | |
|---|---|---|---|
| 4,878,735 A | 11/1989 | Vilums | |
| 5,734,155 A | 3/1998 | Rostoker | |
| 9,099,580 B2 * | 8/2015 | Hirigoyen | ............ G02B 3/0043 |
| 2005/0110104 A1 * | 5/2005 | Boettiger | ......... B29D 11/00375 |
| | | | 257/432 |

(Continued)

*Primary Examiner* — Albert H Cutler
(74) *Attorney, Agent, or Firm* — Treyz Law Group, P.C.; Tianyi He

(57) ABSTRACT

An image sensor may include an array of pixels. Pixels in the array may include a photodiode that converts incident light into electrical charge and a charge storage region for storing the electrical charge before it is read out from the pixel. Pixels in the array may include a microlens formed over the photodiode that directs light onto the photodiode. Pixels in the array may include an additional array of microlenses between the microlens and the photodiode. The additional array of microlenses may direct light away from the charge storage region to prevent charge stored at the charge storage region from being affected by light that is not incident upon the photodiode. The image sensor may be a backside illuminated image sensor that operates in a global shutter mode.

20 Claims, 6 Drawing Sheets

(56) References Cited

U.S. PATENT DOCUMENTS

| | | | |
|---|---|---|---|
| 2005/0242271 A1* | 11/2005 | Weng | H01L 27/14621 250/214.1 |
| 2006/0145056 A1 | 7/2006 | Jung | |
| 2006/0177959 A1* | 8/2006 | Boettiger | H01L 27/14627 438/70 |
| 2006/0292735 A1 | 12/2006 | Boettiger et al. | |
| 2007/0001252 A1* | 1/2007 | Noda | H01L 27/14621 257/432 |
| 2007/0127125 A1 | 6/2007 | Sasaki | |
| 2007/0278604 A1 | 12/2007 | Minixhofer | |
| 2009/0090937 A1 | 4/2009 | Park | |
| 2009/0127440 A1 | 5/2009 | Nakai | |
| 2009/0160965 A1 | 6/2009 | Sorek et al. | |
| 2010/0091168 A1* | 4/2010 | Igarashi | G02B 3/0056 348/340 |
| 2011/0096210 A1 | 4/2011 | Koshino et al. | |
| 2011/0234830 A1* | 9/2011 | Kiyota | H01L 27/14609 257/E31.052 |
| 2013/0015545 A1* | 1/2013 | Toumiya | H01L 27/14605 257/432 |
| 2013/0038691 A1 | 2/2013 | Agranov et al. | |
| 2013/0240962 A1 | 9/2013 | Wang et al. | |
| 2014/0091205 A1* | 4/2014 | Takamiya | H01L 27/14627 250/208.1 |
| 2014/0197301 A1 | 7/2014 | Velichko et al. | |
| 2014/0313379 A1 | 10/2014 | Mackey | |
| 2015/0109501 A1* | 4/2015 | Sekine | H01L 27/1464 348/294 |
| 2016/0111461 A1* | 4/2016 | Ahn | H01L 27/14614 250/208.1 |
| 2016/0211306 A1* | 7/2016 | Choi | H01L 27/14638 |
| 2016/0269662 A1 | 9/2016 | Hepper et al. | |
| 2016/0351610 A1* | 12/2016 | Chen | H01L 27/14627 |
| 2016/0377871 A1 | 12/2016 | Kress et al. | |
| 2017/0077163 A1 | 3/2017 | Chou et al. | |
| 2017/0133420 A1* | 5/2017 | Silsby | H01L 27/14621 |
| 2017/0141145 A1 | 5/2017 | Yamashita et al. | |
| 2017/0176787 A1 | 6/2017 | Jia et al. | |
| 2018/0026065 A1* | 1/2018 | Hsieh | H01L 27/14627 257/432 |
| 2018/0145103 A1* | 5/2018 | Hirigoyen | H01L 27/14627 |

* cited by examiner

IMAGE SENSORS WITH IN-PIXEL LENS ARRAYS

BACKGROUND

This relates generally to imaging devices, and more particularly, to imaging devices having pixels with charge storage regions.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels.

Image sensors of this type may include a charge storage region for storing charge generated by the photodiode before the charge is read out. Light that is incident upon the charge storage region while the charge is being held before readout may cause an unwanted change in the charge storage region, thereby causing the readout from the storage region to inaccurately represent the charge generated by the photodiode.

It would therefore be desirable to provide image sensors with structures for directing incident light away from the charge storage region.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
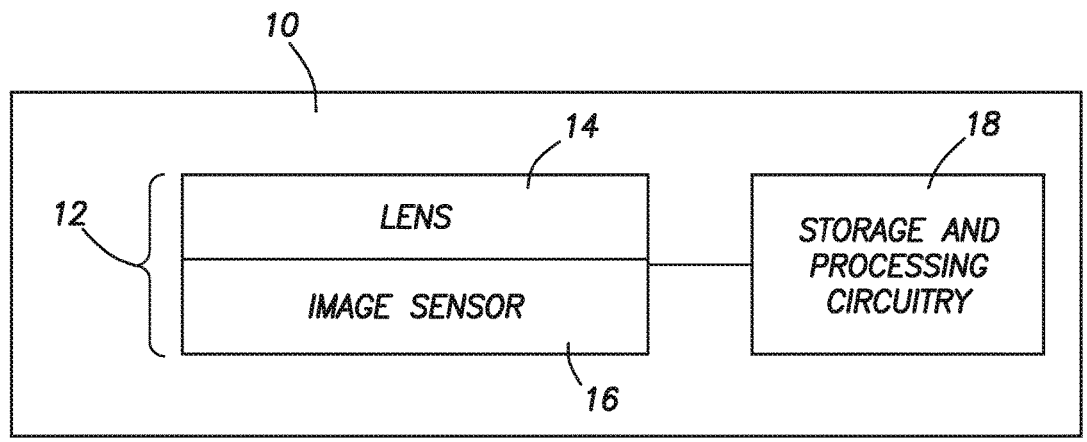
FIG. 1 is a diagram of an illustrative electronic device having an image sensor and processing circuitry for capturing images using a pixel array in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
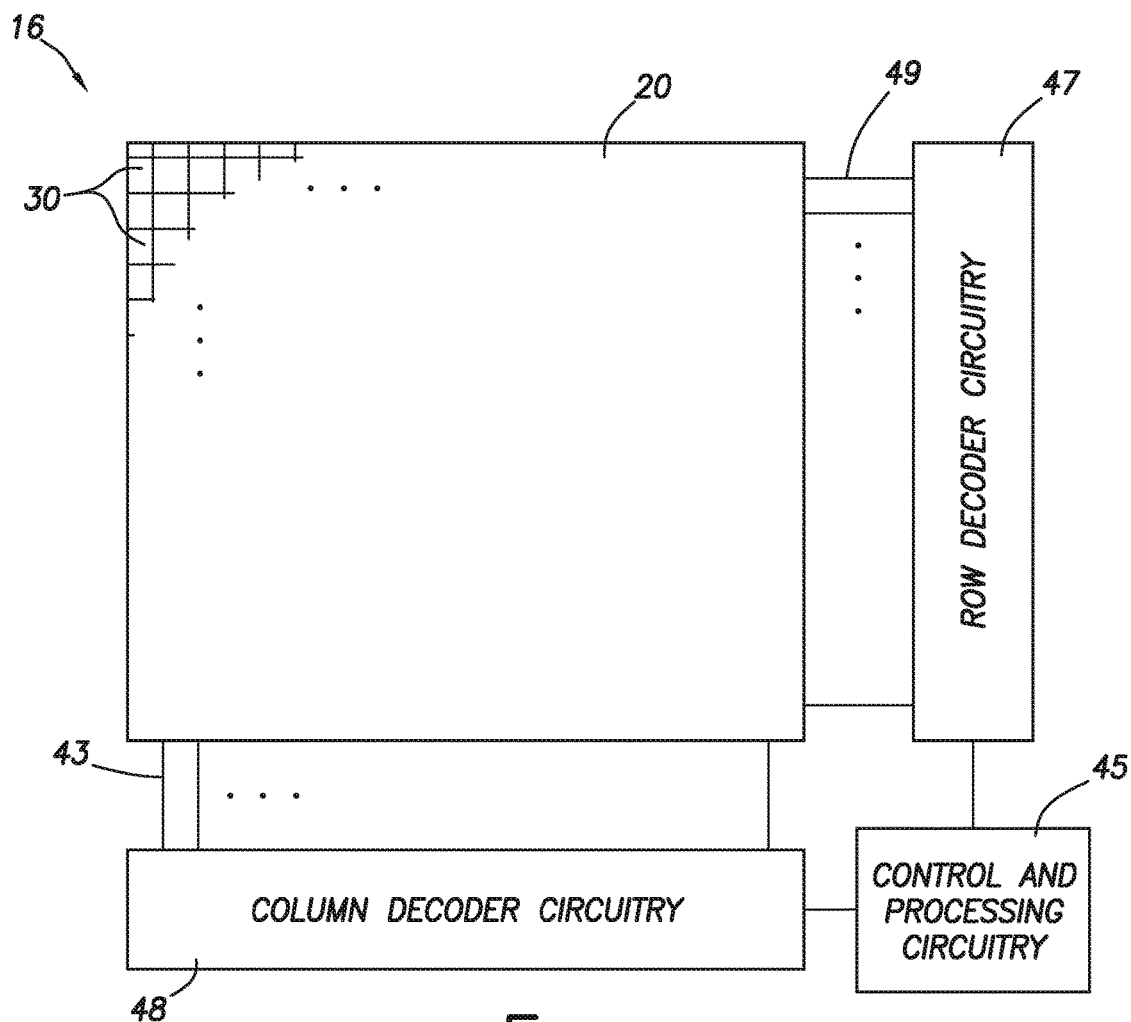
FIG. 2 is a diagram of an illustrative pixel array and associated readout circuitry for reading out image signals from the pixel array in accordance with an embodiment of the present invention.

As shown in FIG. 2, image sensor 16 may include a pixel array 20 containing image sensor pixels 30 arranged in rows and columns (sometimes referred to herein as image pixels or pixels) and control and processing circuitry 45 (which may include, for example, image signal processing circuitry). Array 20 may contain, for example, hundreds or thousands of rows and columns of image sensor pixels 30. Control circuitry 45 may be coupled to row control circuitry 47 and image readout circuitry 48 (sometimes referred to as column control circuitry, readout circuitry, processing circuitry, or column decoder circuitry). Row control circuitry 47 may receive row addresses from control circuitry 45 and supply corresponding row control signals such as reset, row-select, charge transfer, dual conversion gain, and readout control signals to pixels 30 over row control lines 49. One or more conductive lines such as column lines 43 may be coupled to each column of pixels 30 in array 20. Column lines 43 may be used for reading out image signals from pixels 30 and for supplying bias signals (e.g., bias currents or bias voltages) to pixels 30. If desired, during pixel readout operations, a pixel row in array 20 may be selected using row control circuitry 47 and image signals generated by image pixels 30 in that pixel row can be read out along column lines 43.

Image readout circuitry 48 may receive image signals (e.g., analog pixel values generated by pixels 30) over column lines 43. Image readout circuitry 48 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 45 and/or processor 18 (FIG. 1) for pixels in one or more pixel columns.

If desired, a color filter array may be formed over photosensitive regions in array 20 so that a desired color filter element in the color filter array is formed over an upper surface of the photosensitive region of an associated pixel 30. A microlens may be formed over an upper surface of the color filter array to focus incoming light onto the photosensitive region associated with that pixel 30. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 30 in array 20. In another suitable arrangement, an optional masking layer may be interposed between the color filter element and the photosensitive region for one or more pixels 30 in array 20. The masking layers may include metal masking layers or other filtering layers that block a portion of the image light from being received at the photosensitive region. The masking layers may, for example, be provided to some image pixels 30 to adjust the effective exposure level of corresponding image pixels 30 (e.g., image pixels 30 having masking layers may capture less light relative to image pixels 30 without masking layers). If desired, image pixels 30 may be formed without any masking layers.

If desired, pixels 30 in array 20 of FIG. 2 may be provided with an array of color filter elements that each pass one or more colors of light. All or some of pixels 30 may be provided with a color filter element. Color filter elements for pixels 30 may be red color filter elements (e.g., photoresist material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may be configured to filter ultraviolet or infrared light (e.g., a color filter element may only allow infrared light or ultraviolet light to reach the photodiode). Color filter elements may configure image pixel 30 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels and/or broadband pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements. These examples are merely illustrative and, in general, color filter elements of any desired color and in any desired pattern may be formed over any desired number of image pixels 30.

Figure 3:
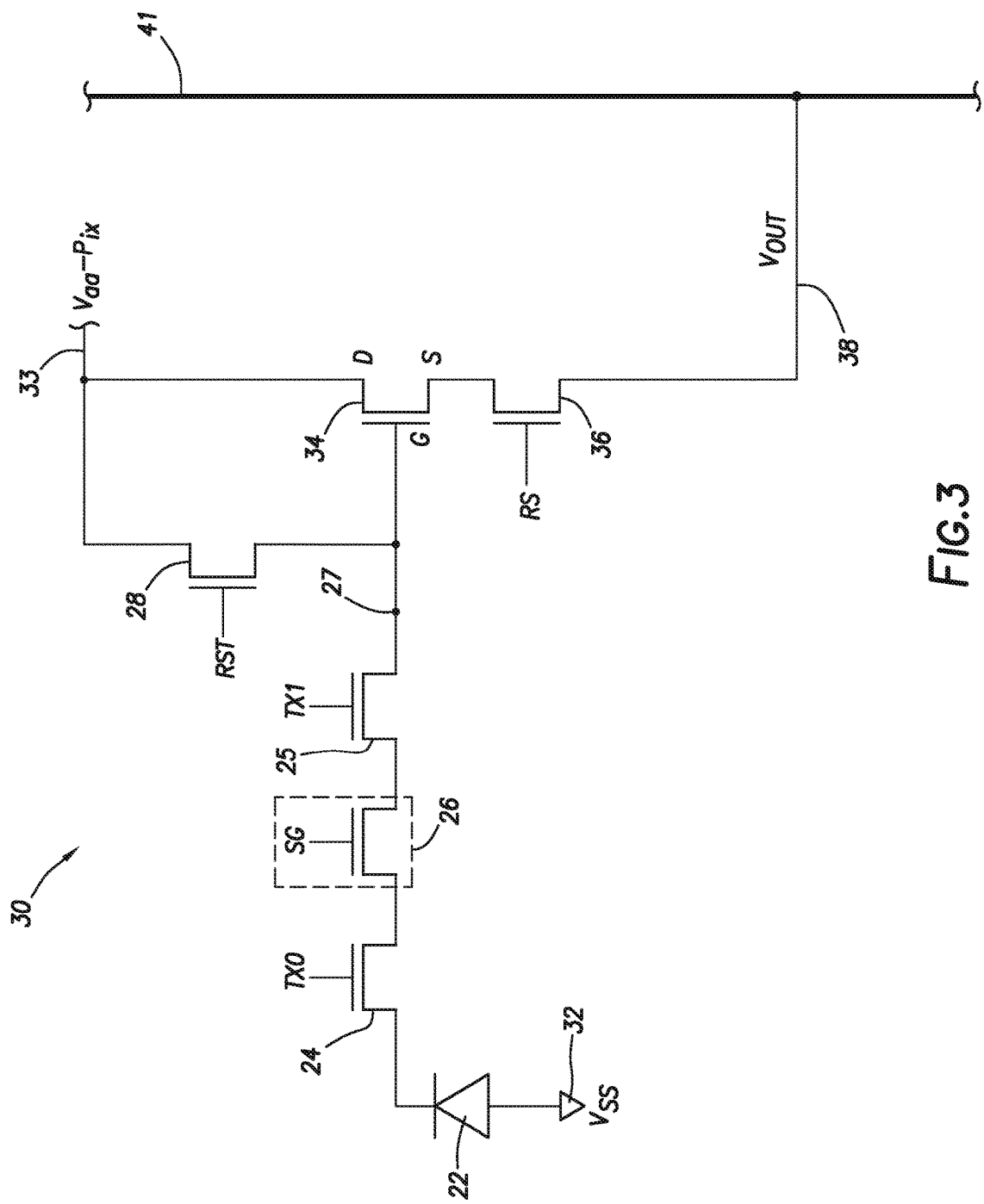
FIG. 3 is a schematic diagram of an illustrative image sensor pixel in accordance with an embodiment of the present invention.

Circuitry in an illustrative image pixel 30 of image pixel array 20 is shown in FIG. 3. As shown in FIG. 3, pixel 30 may include a photosensitive element such as photodiode 22 (sometimes referred to herein as photodetector 22). A positive pixel power supply voltage (e.g., voltage Vaa_pix) may be supplied at positive power supply terminal 33. A ground power supply voltage (e.g., Vss) may be supplied at ground terminal 32. Incoming light is gathered by photodiode 22 after passing through a color filter structure. Photodiode 22 converts the light to electrical charge.

Before an image is acquired, reset control signal RST may be asserted. This turns on reset transistor 28 and resets floating diffusion region 27 (sometimes to herein as a first floating diffusion node) to Vaa_pix. The reset control signal RST may then be deasserted to turn off reset transistor 28.

As shown in FIG. 3, pixel 30 may include a charge storage region 26 (sometimes referred to herein as a memory node, global shutter storage diode, or charge storage node). Although charge storage region 26 is shown as a storage gate SG in FIG. 3, this is merely illustrative. If desired, charge storage region 26 may be a charge storage diode, a charge storage capacitor, or an additional floating diffusion region (sometimes referred to herein as a second floating diffusion node). In general, charge storage node 26 may be implemented using a region of doped semiconductor (e.g., a doped silicon region formed in a silicon substrate by ion implantation, impurity diffusion, or other doping techniques). The doped semiconductor region may exhibit a capacitance that can be used to store charge that has been generated by photodiode 22. First charge transfer transistor 24 (sometimes referred to herein as a first transfer gate) may be asserted to transfer charge generated by photodiode 22 to charge storage region 26. In arrangements in which image sensor 16 is operated in a global shutter mode, the charge generated by each photodiode 22 in each pixel 30 in array 20 may be simultaneously transferred to the respective charge storage region 26 in each pixel 30 at the same time (e.g., transfer gate 24 may be pulsed high simultaneously for each pixel 30 in array 20).

Once the charge generated by each photodiode 22 in array 20 has been transferred to a respective charge storage region 26, the readout of charge from the charge storage region 26 may proceed in a sequential row-by-row manner for each row of pixels in array 20. Charge may be transferred from charge storage region 26 to floating diffusion 27 by asserting second charge transfer transistor 25 (sometimes referred to herein as a second transfer gate). Floating diffusion 27 may be implemented using a region of doped semiconductor (e.g., a doped silicon region formed in a silicon substrate by ion implantation, impurity diffusion, or other doping techniques). The doped semiconductor region may exhibit a capacitance that can be used to store charge that has been generated by photodiode 22 and transferred from charge storage region 26. The signal associated with the stored charge on floating diffusion node 27 is buffered by source-follower transistor 34. Row select transistor 36 connects the source follower transistor 34 to column output line 41.

When it is desired to read out the value of the stored charge on floating diffusion 27 (i.e., the value of the stored charge that is represented by the signal at the source S of transistor 34), row select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 30 in the image sensor pixel array of a given image sensor. A conductive path such as path 41 can be associated with one column of image pixels 30.

When signal RS is asserted in a given of pixel 30, path 41 can be used to route signal Vout from the pixel 30 to readout circuitry (e.g., 48 in FIG. 2).

If desired, other types of image pixel circuitry may be used to implement the image pixels of sensors 16. For example, each image sensor pixel 30 may be a three-transistor pixel, a pinned-photodiode pixel with four transistors, etc. The circuitry of FIG. 3 is merely illustrative.

As described above, every pixel may simultaneously capture an image in an image sensor operating in a global shutter scheme. In a global shutter scheme, all of the pixels in an image sensor may be reset simultaneously. A charge storage region 26 is typically incorporated into each pixel. The first transfer operation (asserting transfer gate TX0) is then used to simultaneously (globally) transfer the charge collected in the photodiode of each image pixel to the associated storage region 26 to store the charge until the second transfer operation (asserting transfer gate TX1) is performed on a row-by-row basis and the charge is read out. With such an arrangement, however, light that is incident upon the charge storage region 26 instead of the photodiode 22 while the charge is being held at charge storage region 26 before second charge transfer transistor 25 is taken high (i.e., before readout) may cause excess charge to be generated in the charge storage region 26. This can cause the charge level read out from the storage region 26 to not be an entirely accurate representation of the actual charge generated by the photodiode 22. This may corrupt the readout from the pixel 30. In addition, light that is incident upon the charge storage region 26 instead of the photodiode 22 is not converted to charge by the photodiode 22, rendering the readout from the photodiode 22 unrepresentative of the actual amount of light incident upon the pixel 30.

While backside illuminated image sensors (i.e., image sensors in which metal routing structures for the pixels are beneath the photodiodes such that light does not pass through the metal routing structures before reaching the photodiodes) generally provide higher quantum efficiency than frontside illuminate image sensors (i.e., image sensors in which metal routing structures for the pixels are between the photodiodes and the microlenses such that light does pass through the metal routing structures before reaching the photodiodes), a backside illuminated image sensor operating in a global shutter scheme is generally more susceptible to light penetration and absorption in and around the charge storage region 26 than is a frontside illuminate image sensors operating in a global shutter scheme. This can lead to backside illuminated global shutter image sensors having a lower global shutter efficiency than a frontside illuminated global shutter image sensor. Reducing the amount of light that reaches the charge storage region 26 may increase the global shutter efficiency of backside illuminated sensors.

Figure 4:
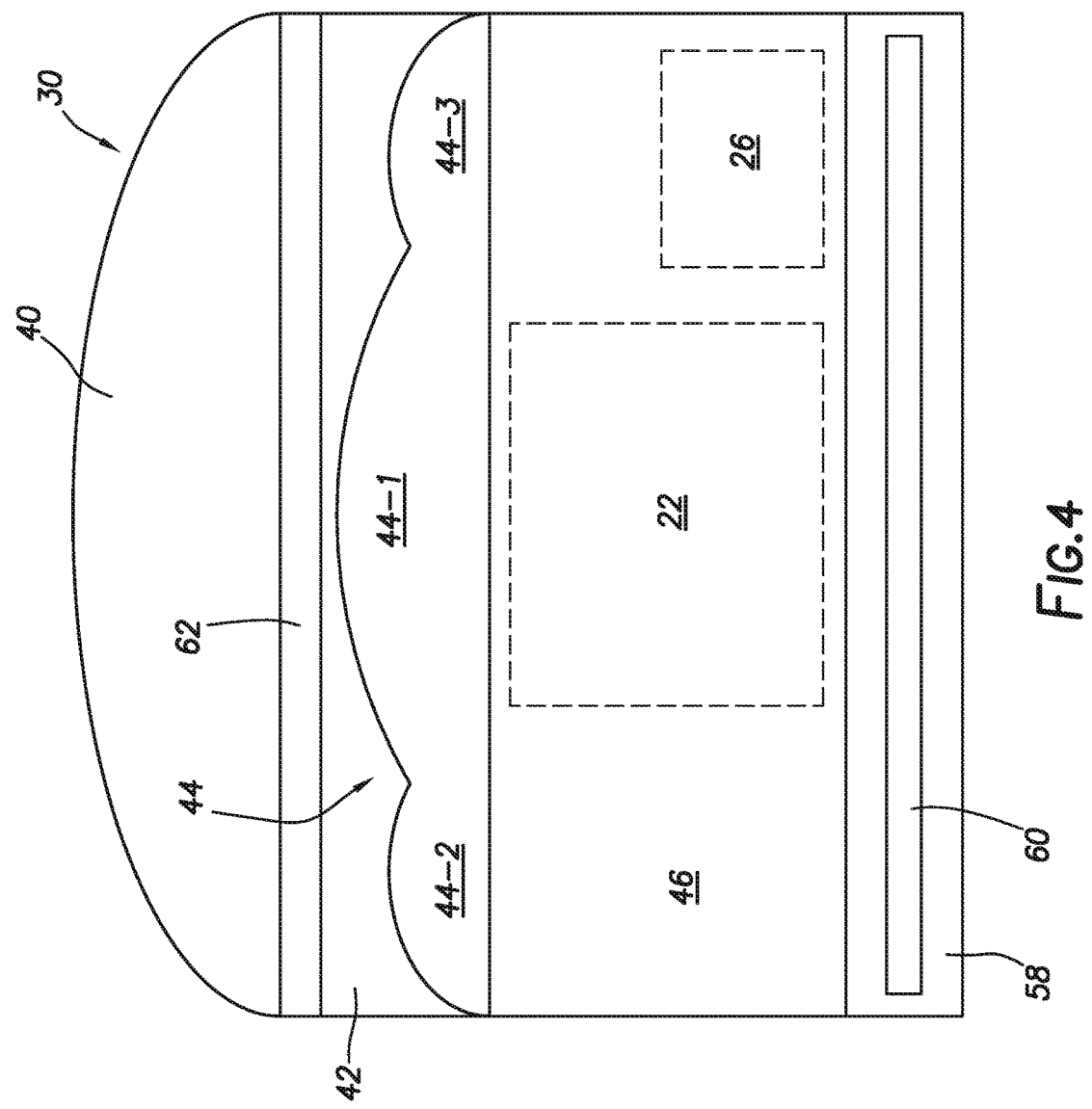
FIG. 4 is a cross-sectional side view of an illustrative image sensor pixel having an in-pixel lens array in accordance with an embodiment of the present invention.

A cross-sectional side view of a pixel 30 is shown in FIG. 4. Pixel 30 may include a layer of silicon 46 in which photodiode 22 and charge storage region 26 may be formed. A dielectric layer 58 (sometimes referred to herein as an interconnect layer) beneath silicon layer 46 may include a metal layer(s) 60 (sometimes referred to herein as conductive paths or metal routing structures) that form conductive structures in pixel 30 of the type shown in FIG. 3 (e.g., pixel structures such as transfer transistors, reset transistors, row select transistors, source-follower transistors, pixel power supply voltage lines, ground power supply voltage lines, pixel readout lines, column output lines, etc.). A microlens 40 (sometimes referred to herein as a lens) may be formed over photodiode 22 to help direct incident light onto photodiode 22. A color filter element 62 may be formed between the layer of silicon 46 and the microlens 40.

In order to increase the amount of incident light that reaches photodiode 22 and minimize the amount of light that is incident upon charge storage region 26, pixel 30 may be provided with a microlens array 44 (sometimes referred to herein as a diffractive lens array, an in-pixel lens array, a diffractive microlens array, a group of microlenses, or a set of microlenses). Microlens array 44 may include multiple individual microlens structures 44-1, 44-2, and 44-3. As shown in FIG. 4, microlens array 44 may have a central microlens 44-1 that has a first height (thickness) and a first diameter (width) and one or more peripheral microlenses 44-2 and 44-3. Peripheral microlenses 44-2 and 44-3 may each have second heights (thicknesses) that are less than the first height of central microlens 44-1 and may each have second diameters (widths) that are less than the first diameter of central microlens 44-1. The heights and diameters of peripheral microlenses 44-2 and 44-3 may be the same or may be different. A microlens array of the type shown in FIG. 4 may help further direct light that has already passed through microlens 40 away from charge storage region 26 and towards photodiode 22. Although FIG. 4 shows only one pixel, this is merely illustrative. If desired, multiple pixels or every pixel in array 20 may be provided with a separate respective microlens 40 and a separate respective microlens array 44. In such an arrangement, the microlenses 40 may collectively be referred to as a microlens layer, lenses, or a lens layer. The microlens arrays 44 may collectively be referred to as a microlens layer or a microlens array layer. By concentrating light more effectively towards the photodiodes 22 in the respective pixels in the array (e.g., away from storage regions 26), micro lens arrays 44 may improve the global shutter efficiency of the pixels.

If desired, a planarizing layer 42 may be provided between microlens 40 and microlens array 44. Planarizing layer 42 may provide a planar surface on which microlens 40 can be formed. Planarizing layer 42 is, however, merely optional. If desired, planarizing layer 42 may be omitted, and microlens 40 may be formed directly on the surface microlens array 44 (e.g., the material for microlens 40 may fill in the uneven surfaces and gaps between the microlenses in array 44).

In the illustrative example of FIG. 4, color filter element 62 is between microlens 40 and microlens array 44. This, however, is merely illustrative. If desired, color filter element 62 may be formed between silicon layer 46 and microlens array 44.

Materials suitable for microlens 40 and microlens array 44 include silicon oxynitride, silicon nitride, tantalum oxides such as tantalum pentoxide, and other dielectric materials. In general, the material used for microlens 40 and microlens array 44 should have a sufficiently high refractive index (e.g., a refractive index in the range of about 1.4 to 4.0) to redirect light away from charge storage region 26 and towards photodiode 22. In one illustrative example, microlens 40 may have a refractive index of approximately 1.4. Microlens array 44 may have a refractive index of approximately 1.8. If present, planarizing layer 42 may be formed of a dielectric material similar to those mentioned above in connection with microlens 40 and microlens array 44, and may have a refractive index between that of microlens 40 and microlens array 44. In another suitable arrangement, microlenses in array 44 may have an index of refraction of approximately 2, while the layers of material surrounding array 44 (e.g., microlens 40 and planarizing layer 42, if present) may have indices of refraction of approximately 1.46-1.6. In general, the refractive indices of the materials used for microlens 40, planarizing layer 42, and microlens array 44 should increase the closer the layer is to silicon layer 46 to ensure that the lens structures can redirect light away from charge storage region 26. If desired, each microlens structure 44-1, 44-2, and 44-3 in array 44 may be made of the same material and have the same index of refraction, or one or more of the microlens structures in array 44 may be formed of a different material and have a different index of refraction than the others.

In the illustrative example of FIG. 4, microlens 40 and microlens array 44 are both centered over photodiode 22. While this arrangement may be used (e.g., for a pixel located at the center of array 20), it is merely illustrative. In order to account for differences in the chief ray angle of incoming light at different locations in array 20, microlens 40 and/or microlens array 44 may be shifted (sometimes referred to herein as optical element shifting) such that their centers are not centered over photodiode 22. For example, the centers of microlens 40 and/or microlens array 44 in a pixel near the edge of array 20 may be shifted to the left or right over the center of photodiode 22. This may help direct light onto photodiode 22 despite a high chief ray angle. If desired, microlens 40 and microlens array 44 may be shifted over photodiode 22 by different distances (e.g., the shift of microlens 40 may be greater than or less than the shift of microlens array 44). Microlens 40 and/or microlens array 44 may be shifted in any direction over photodiode 22, and may be shifted in different directions within a single pixel 30, if desired. Color filter elements 62 may be shifted in the same manner as microlens 40 and/or microlens array 44.

Figure 5:
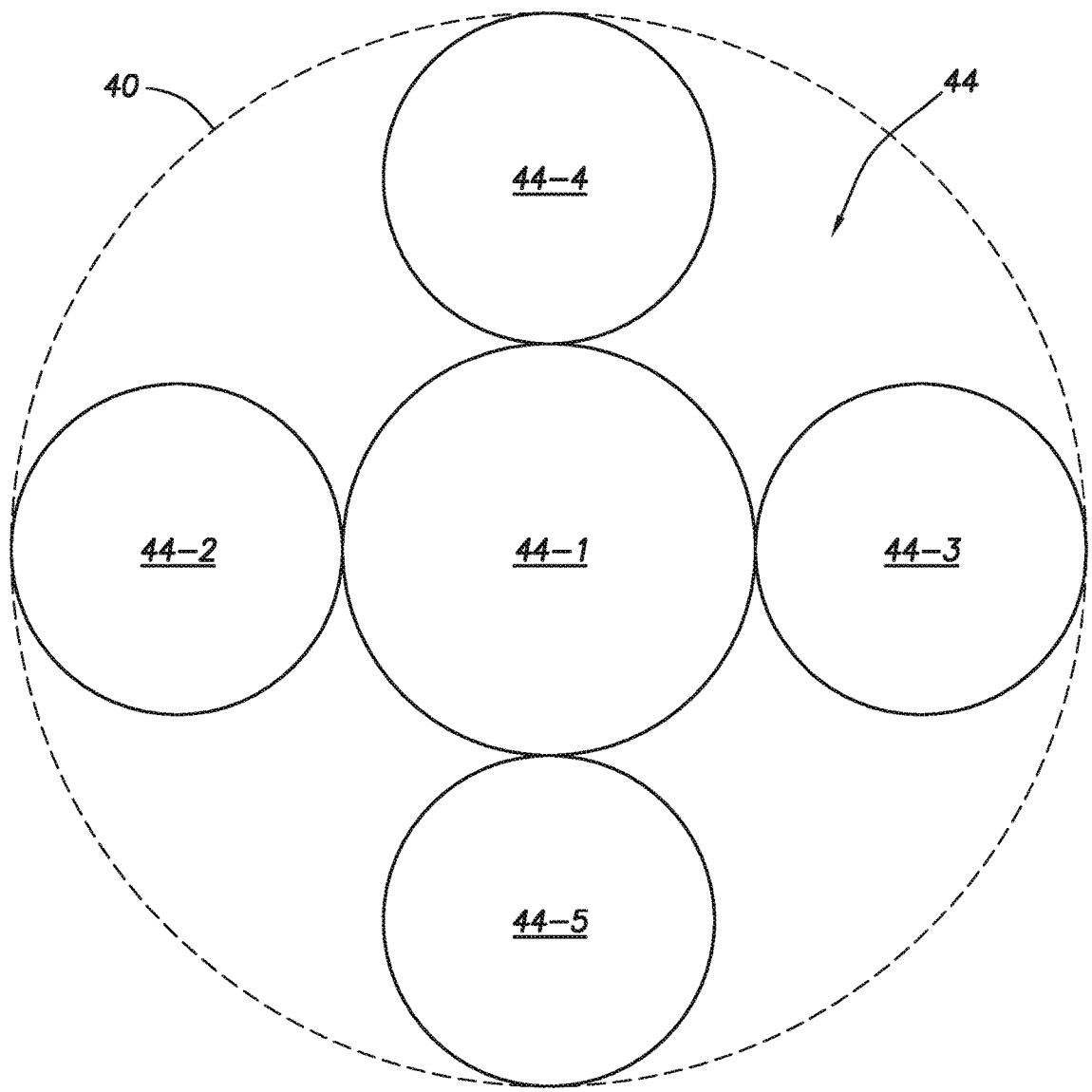
FIG. 5 is a top view of an illustrative in-pixel lens array of the type shown in FIG. 4 in accordance with an embodiment of the present invention.

FIG. 5 is a top-down view of lens structures of the type show in FIG. 4. Although not visible in the cross-sectional side view of FIG. 4, two other microlens structures 44-4 and 44-5 in array 44 are shown in FIG. 5. These additional microlens structures 44-4 and 44-5 may be identical to microlenses 44-2 and 44-3 as described above in terms of shape, dimensions, material, and/or index of refraction, or may be different. The microlenses in array 44 may be formed of a single piece of material, or may be formed separately. Together, the microlenses in microlens array 44 may further redirect light from microlens 40 away from charge storage region 26 and towards photodiode 22.

In the illustrative example of FIG. 5, microlens 40 is shown as having a diameter equal to the total combined diameters of microlens structures 44-1, 44-2, and 44-3. This, however, is merely illustrative. If desired, microlens 40 may have a diameter that is greater than the combined diameters of the microlenses in array 44, or may have a smaller diameter than these combined diameters.

The number of microlenses in array 44 is merely illustrative. In general, an array of the type shown in FIG. 5 may include anywhere from two to one hundred, one thousand, ten thousand, or more microlenses. In some illustrative examples, an array of microlenses 44 may include five, seven, nine, eleven, thirteen, fifteen, or more microlenses.

The size of the microlenses in array 44 is merely illustrative. Microlenses in array 44 may have diameters (widths) ranging from 2 microns down to sub-wavelength dimensions such approximately 500 nanometers. In one illustrative arrangement, microlens 40 may have a diameter of approximately 5 microns, central microlens 44-1 may a diameter of approximately 2 microns, and peripheral microlenses 44-2, 44-3, 44-4, and 44-5 may have diameters of approximately 1.4 microns. If desired, however, all of the microlenses in array 44 may have the same diameter, or peripheral microlenses 44-2, 44-3, 44-4, and 44-5 may have larger diameters than central microlens 44-1. The heights (thicknesses) of microlenses in array 44 may also vary. In one example, peripheral microlenses 44-2, 44-3, 44-4, and 44-5 may be thinner than central microlens 44-1. If desired, however, all of the microlenses in array 44 may have the same thickness, or peripheral microlenses 44-2, 44-3, 44-4, and 44-5 may have be thicker than central microlens 44-1. The radius of curvature of microlenses in array 44 may also vary. In one example, central microlens 44-1 may have a larger radius of curvature than the radius of curvature of each of the peripheral microlenses 44-2, 44-3, 44-4, and 44-5. If desired, however, all of the microlenses in array 44 may have the same radius of curvature, or peripheral microlenses 44-2, 44-3, 44-4, and 44-5 may each have a radius of curvature that is larger than the radius of curvature of central microlens 44-1.

The spatial arrangement of microlenses in array 44 is merely illustrative. If desired, peripheral microlenses may completely surround central microlens 44-1. In another example, one or all of the peripheral microlenses may be rotated about the center of microlens 44-1 by anywhere from one degree up to three hundred and sixty degrees. If desired, there may be no central microlens in array 44. Microlenses in array 44 may be arranged in rows and columns (e.g., a two-by-two array, a three-by-three array, etc.), arranged in a triangular pattern, arranged in an elliptical pattern, or arranged in other suitable configurations. The symmetry and centering of micro lens pattern 44 within the pixel may be chosen to correspond with the symmetry of the arrangement of photo diode 22 and storage area 26 in a pixel for optimum light concentration on photo diode 22 and away from storage area 26. Micro lenses 44 may be formed to overlap each other in part when formed in multiple subsequent reflow process steps.

The circular (semi-spherical) shape of microlenses in array 44 is merely illustrative. In general, microlenses 44 may have any suitable shape. From a top-down view of the type shown in FIG. 5, microlenses in array 44 may have a square shape, a rectangular shape, a square shape with rounded edges, a triangular shape, an elliptical shape, an asymmetric shape, or other suitable shapes. When viewed from a cross-sectional side view of the type shown in FIG. 4, microlenses 44 may have a triangular cross-sectional profile, a square cross-sectional profile, a rectangular cross-sectional profile, may have a rounded cross-sectional profile (e.g., of the type shown in FIG. 4), or may have other suitable cross-sectional profiles. Microlenses 44 may include concave lenses, convex lenses, or have optical surfaces with other curvatures.

Due to the tendency of light of different wavelengths to refract at different angles, the number, size, configuration, and shape of microlenses in array 44 may be different for each color of pixel 30 in pixel array 20. For example, red pixels in array 20 may incorporate a first type of microlens array 44, green pixels in array 20 may incorporate a second type of microlens array that is different than the first type, and blue pixels in array 20 may incorporate a third type of microlens array that is different than the first and/or second types.

Figure 6:
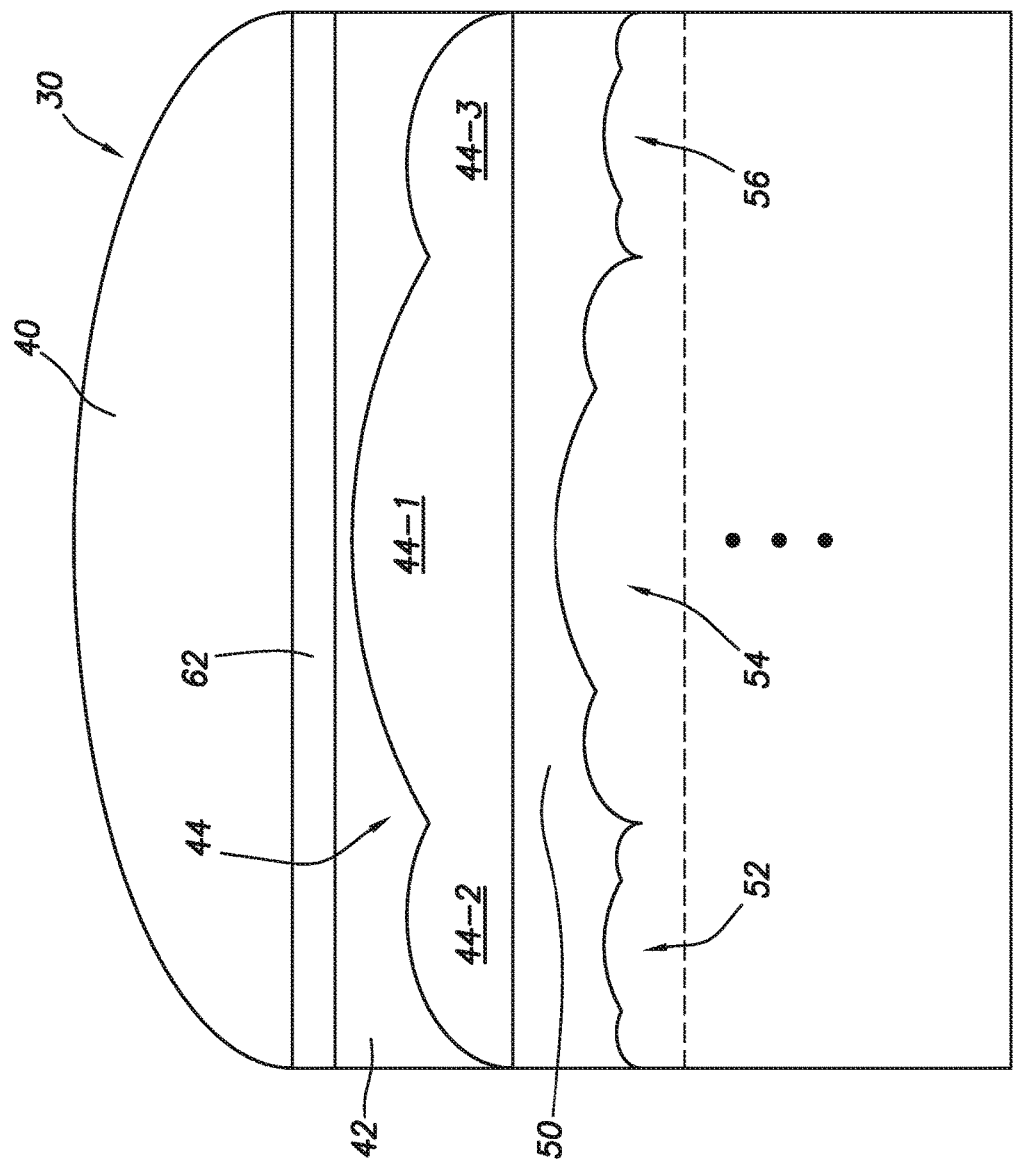
FIG. 6 is a cross-sectional side view of a portion of an illustrative image sensor pixel having multiple in-pixel lens arrays in accordance with an embodiment of the present invention.

If desired, multiple layers of microlens arrays may be incorporated into a single pixel 30. A cross-sectional side view of a pixel 30 having such an arrangement is shown in FIG. 6. Each of the microlenses in primary microlens array 44 (i.e., 44-1, 44-2, and 44-3, as well as 44-4 and 44-5, although not shown in FIG. 6) has an additional secondary microlens array (sometimes referred to herein as a secondary microlens layer or a second microlens layer) formed beneath it. In the example of FIG. 6, microlens 44-1 overlaps and directs light onto microlens array 54, microlens 44-2 overlaps and directs light onto microlens array 52, and microlens 44-3 overlaps and directs light onto microlens array 56. In general, secondary microlens arrays may be formed of the same materials as those described above in connection with primary microlens array 44 (sometimes referred to herein as a primary microlens layer or a first microlens layer), and should have a higher index of refraction than microlens array 44. Secondary microlens arrays may also vary in terms of the number of microlenses they contain, the size of the lenses and the array as a whole, the spatial arrangement of the lenses in the array, the shape of the lenses, and the shape of the array as a whole as described above in connection with microlens array 44. The number of microlenses in the array, the size of the lenses and the array as a whole, the spatial arrangement of the lenses in the array, the shape of the lenses in the array, and the shape of the array as a whole may be the same as or different than microlens array 44. If desired, optional planarization layer 50 may be formed over microlens arrays 52, 54, and/or 56 in the same manner as planarization layer 42.

Although two layers of microlens arrays are shown in FIG. 6, this is merely illustrative. If desired, a single pixel 30 may include a primary microlens array, a secondary microlens array, a tertiary microlens array, and a quaternary microlens array, each having a nested configuration of the type described above in connection with primary microlens array 44 and secondary microlens arrays 52, 54, and 56. If desired, five, ten, fifteen, or more layers of in-pixel microlenses may be incorporated into a single pixel 30.

In the illustrative example of FIG. 6, color filter element 62 is shown between microlens 40 and primary microlens array 44. This is merely illustrative. If desired, color filter element 62 may be between primary microlens array 44 and the secondary microlens arrays 52, 54, and 56. In general color filter elements 62 may be formed between any two lens or microlens layers.

Figure 7:
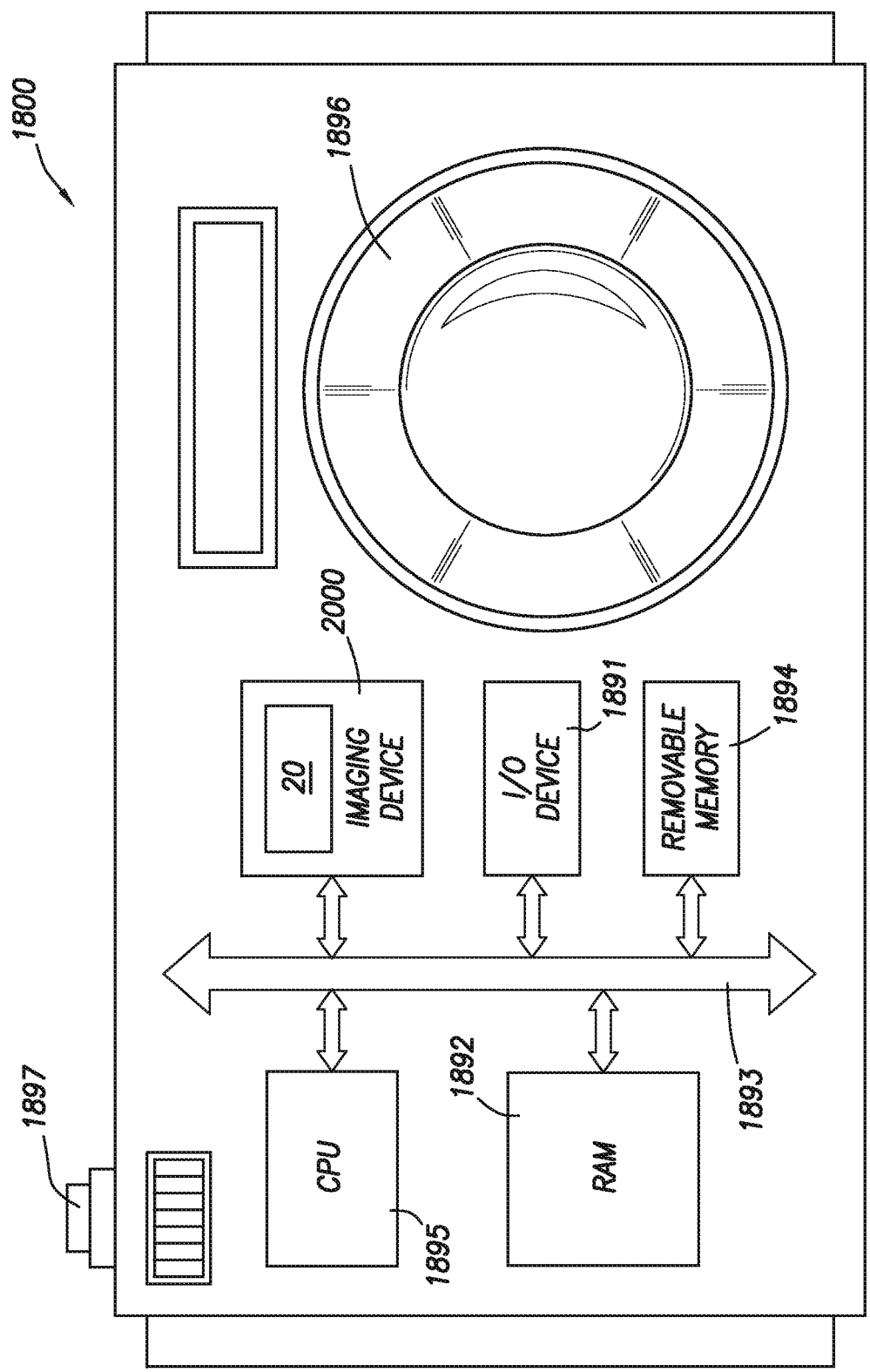
FIG. 7 is a block diagram of an illustrative image capture and processor system employing the embodiments of FIGS. 1-6 in accordance with an embodiment of the present invention.

FIG. 7 shows in simplified form a typical image capture and processor system 1800, such as a digital camera, which includes an imaging device 2000 (e.g., an imaging device 2000 such as image sensor 16 of FIGS. 1-6 employing pixels 30 having in-pixel microlens arrays). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The image capture and processor system 1800 generally includes a lens 1896 for focusing an image on pixel array 20 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

In accordance with various embodiments, a pixel may include a layer of silicon, a photodiode formed in the layer of silicon, a charge storage region formed in the layer of silicon, a microlens that directs light onto the photodiode, and a microlens array interposed between the microlens and the photodiode. The microlens array may direct light that has passed through the microlens away from the charge storage region. The pixel may include a dielectric layer. The layer of silicon may be interposed between the dielectric layer and the microlens array. The pixel may include conductive paths in the dielectric layer. Electrical charge generated by the photodiode in response to incident light may be read out on the conductive paths. The microlens array may include a central microlens and peripheral microlenses that surround the central microlens. The central microlens may have a first diameter and each of the peripheral microlenses may have a second diameter that is less than the first diameter. The microlens formed over the microlens array may have a third diameter that is greater than the first and second diameters. The microlens formed over the microlens array may have a first index of refraction, and the central microlens and each of the peripheral microlenses in the microlens array may have a second index of refraction that is greater than the first index of refraction. The microlens array may be a primary microlens array. The pixel may further include a secondary microlens array between the primary microlens array and the photodiode. Charge generated by the photodiode in response to incident light may be read out in a global shutter scheme. The pixel may include a planarization layer between the microlens and the microlens array.

In accordance with various embodiments, a pixel array may include a layer of silicon. Each respective pixel in the array may include a photodiode and a charge storage region formed in the layer of silicon. The pixel array may include a layer of lenses. Each respective pixel in the array may include a single lens in the layer of lenses that overlaps the photodiode in the respective pixel and directs light onto the photodiode in the respective pixel. The pixel array may include a layer of microlenses between the layer of silicon and the layer of lenses. Each respective pixel in the array may include a group of microlenses in the layer of microlenses that overlap the single lens in the respective pixel and direct light away from the charge storage region in the respective pixel. The group of microlenses in each respective pixel in the array may include a first microlens having a first radius of curvature and a second microlens having a second radius of curvature that is different than the first radius of curvature. The group of microlenses in each respective pixel in the array may include a third microlens. The first microlens in each respective pixel may be a central microlens at a center of the group of microlenses in each respective pixel. The second microlens and the third microlens in each respective pixel may be peripheral microlenses that surround the central microlens. The lens in each respective pixel in the array may have a first index of refraction. The first microlens and the second microlens in each respective pixel in the array may have a second index of refraction that is greater than the first index of refraction. The layer of microlenses may be a first layer of microlenses. The pixel array may include a second layer of microlenses between the layer of silicon and the first layer of microlenses. Each respective pixel in the array may include a group of microlenses in the second layer of microlenses that overlaps the group of microlenses in the first layer of microlenses in the respective pixel. Each respective pixel in the array may include more microlenses from the second layer of microlenses than from the first layer of microlenses. The pixel array may include a layer of color filter elements. A first pixel in the array may include a first color filter element that passes light of a first color and a second pixel in the array may include a second color filter element that passes light of a second color that is different than the first color. A first group of microlenses in the layer of microlenses in the first pixel may have a first index of refraction. A second group of microlenses in the layer of microlenses in the second pixel may have a second index of refraction that is different than the first index of refraction. The first group of microlenses in the layer of microlenses in the first pixel may have a first diameter. The second group of microlenses in the layer of microlenses in the second pixel may have a second diameter that is different than the first diameter.

In accordance with various embodiments, a system may include a central processing unit, memory, input-output circuitry, and an image sensor that includes a pixel array. Each pixel in the array may include a photodiode formed in a layer of silicon, a charge storage node formed in the layer of silicon, a microlens that directs light onto the photodiode, and a group of diffractive lenses between the microlens and the layer of silicon. The group of diffractive lenses may direct light that has passed through the microlens to the photo diode and away from the charge storage node. The image sensor may be a backside illuminated image sensor. The image sensor may operate in a global shutter mode.

The foregoing is merely illustrative of the principles of this invention and various modifications can be made by those skilled in the art without departing from the scope and spirit of the invention. The foregoing embodiments may be implemented individually or in any combination.

What is claimed is:

1. A pixel, comprising:
   a substrate;
   a photodiode formed in the substrate;
   a charge storage region formed in the substrate;
   a microlens that directs light onto the photodiode; and
   a microlens array interposed between the microlens and the photodiode, wherein the microlens array directs light that has passed through the microlens away from the charge storage region and comprises:
      a central microlens having a first diameter; and
      a peripheral microlens having a second diameter that is less than the first diameter.

2. The pixel defined in claim 1, further comprising:
   a dielectric layer, wherein the substrate is interposed between the dielectric layer and the microlens array; and
   conductive paths in the dielectric layer on which electrical charge generated by the photodiode in response to incident light is read out.

3. The pixel defined in claim 1, wherein the microlens array comprises:
   a plurality of additional peripheral microlenses, wherein the plurality of additional peripheral microlenses and the peripheral microlens surround the central microlens.

4. The pixel defined in claim 3, wherein each of the plurality of additional peripheral microlenses has a diameter that is less than the first diameter.

5. The pixel defined in claim 1, wherein the microlens has a third diameter that is greater than the first and second diameters.

6. The pixel defined in claim 1, wherein the microlens has a first index of refraction and wherein the central microlens and the peripheral microlens each has an index of refraction that is greater than the first index of refraction.

7. The pixel defined in claim 1, wherein the microlens array is a primary microlens array, the pixel further comprising:
   a secondary microlens array interposed between the primary microlens array and the photodiode.

8. The pixel defined in claim 1, wherein charge generated by the photodiode in response to incident light is read out in a global shutter scheme.

9. The pixel defined in claim 1, further comprising:
a planarization layer interposed between the microlens and the microlens array.

10. A pixel array comprising:
a layer of silicon, wherein each respective pixel in the array includes a photodiode and a charge storage region formed in the layer of silicon;
a layer of lenses, wherein each respective pixel in the array includes a single lens in the layer of lenses that overlaps the photodiode in the respective pixel and directs light onto the photodiode in the respective pixel; and
a layer of microlenses interposed between the layer of silicon and the layer of lenses, wherein each respective pixel in the array includes a plurality of microlenses in the layer of microlenses that overlap the single lens in the respective pixel and direct light away from the charge storage region in the respective pixel and wherein the plurality of microlenses in each respective pixel in the array comprises:
a first microlens having a first radius of curvature; and
a second microlens having a second radius of curvature that is different than the first radius of curvature.

11. The pixel array defined in claim 10, wherein the plurality of microlenses in each respective pixel in the array comprises:
a third microlens, wherein the first microlens in each respective pixel is a central microlens at a center of the plurality of microlenses in each respective pixel, and wherein the second microlens and the third microlens in each respective pixel are peripheral microlenses that surround the central microlens.

12. The pixel array defined in claim 10, wherein the lens in each respective pixel in the array has a first index of refraction, and wherein the first microlens and the second microlens in each respective pixel in the array has a second index of refraction that is greater than the first index of refraction.

13. The pixel array defined in claim 10, wherein the layer of microlenses is a first layer of microlenses, the pixel array further comprising:
a second layer of microlenses interposed between the layer of silicon and the first layer of microlenses, wherein each respective pixel in the array comprises:
a plurality of microlenses in the second layer of microlenses that overlap the plurality of microlenses in the first layer of microlenses in the respective pixel.

14. The pixel array defined in claim 13, wherein each respective pixel in the array comprises more microlenses that are in the second layer of microlenses than are in the first layer of microlenses.

15. The pixel array defined in claim 10, further comprising:
a layer of color filter elements, wherein a first pixel in the array includes a first color filter element that passes light of a first color, wherein a second pixel in the array includes a second color filter element that passes light of a second color that is different than the first color, wherein a first plurality of microlenses in the layer of microlenses in the first pixel have a first index of refraction, and wherein a second plurality of microlenses in the layer of microlenses in the second pixel have a second index of refraction that is different than the first index of refraction.

16. The pixel array defined in claim 10, further comprising:
a layer of color filter elements, wherein a first pixel in the array includes a first color filter element that passes light of a first color, wherein a second pixel in the array includes a second color filter element that passes light of a second color that is different than the first color, wherein a first plurality of microlenses in the layer of microlenses in the first pixel have a first diameter, and wherein a second plurality of microlenses in the layer of microlenses in the second pixel have a second diameter that is different than the first diameter.

17. A system, comprising:
a central processing unit;
memory;
input-output circuitry; and
an image sensor comprising:
a pixel array, a pixel in the pixel array comprising:
a photosensitive element formed in a substrate layer;
a charge storage node formed in the substrate layer;
a microlens that directs light onto the photosensitive element; and
a plurality of diffractive lenses interposed between the microlens and the substrate layer, wherein the plurality of diffractive lenses comprises a plurality of lenses that overlap the pixel and that each has an index of refraction that is greater than an index of refraction of the microlens.

18. The system defined in claim 17, wherein the image sensor is a backside illuminated image sensor.

19. The system defined in claim 15, wherein the plurality of lenses comprises a central lens and a plurality of peripheral lenses that surround the central lens.

20. The system defined in claim 19, wherein each peripheral lens in the plurality of peripheral lenses has a size that is different from a size of the central lens.

* * * * *